United States Patent [19]

Wolfe et al.

[11] Patent Number: 5,047,394
[45] Date of Patent: Sep. 10, 1991

[54] SPUTTERING METHOD

[75] Inventors: John C. Wolfe; Yat-lung R. Chau, both of Houston; Wong-sik S. Ho, Stafford, all of Tex.

[73] Assignee: University of Houston System, Houston, Tex.

[21] Appl. No.: 406,071

[22] Filed: Sep. 12, 1989

[51] Int. Cl.⁵ .............................................. H01L 39/24
[52] U.S. Cl. ..................................... 505/1; 204/192.24; 204/298.21; 505/816; 505/731
[58] Field of Search ...................... 204/192.12, 192.15, 204/192.24, 298.21, 298.12, 298.13, 298.16; 505/1, 816, 731

[56] References Cited

U.S. PATENT DOCUMENTS

| 2,146,025 | 2/1939 | Penning | 204/298.16 X |
| 3,945,911 | 3/1976 | McKelvey | 204/298.25 |
| 4,126,530 | 11/1978 | Thornton | 204/192.3 |
| 4,828,664 | 5/1989 | Dietrich et al. | 204/192.24 |
| 4,842,704 | 6/1989 | Collins et al. | 204/192.24 |

FOREIGN PATENT DOCUMENTS

| 0309294A2 | 3/1989 | European Pat. Off. | 204/192.24 |
| 53-7585 | 1/1978 | Japan | 204/298.16 |

Primary Examiner—Aaron Weisstuch
Attorney, Agent, or Firm—Johnson & Gibbs

[57] ABSTRACT

Combination of a flattened cathode in a cylindrical magnetron sputtering system and positioning of a substrate relatively close to the flattened cathode allows deposition of a uniform film having good composition. The system and method of the present invention is especially suitable for depositing films using YBCO and BCSCO targets.

1 Claim, 6 Drawing Sheets

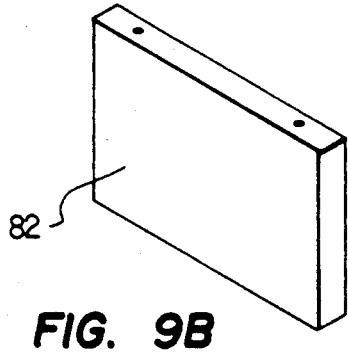
FIG. 9B
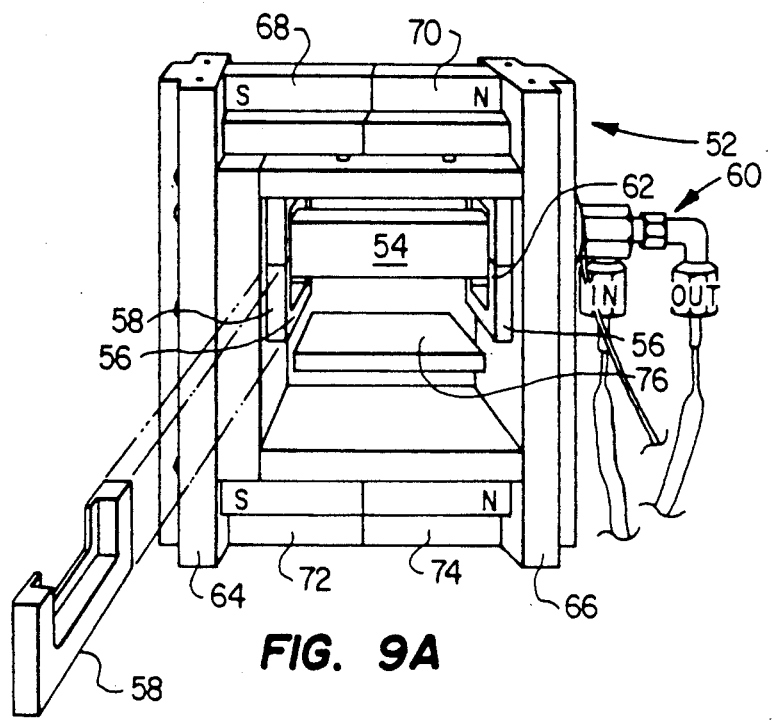
FIG. 9A
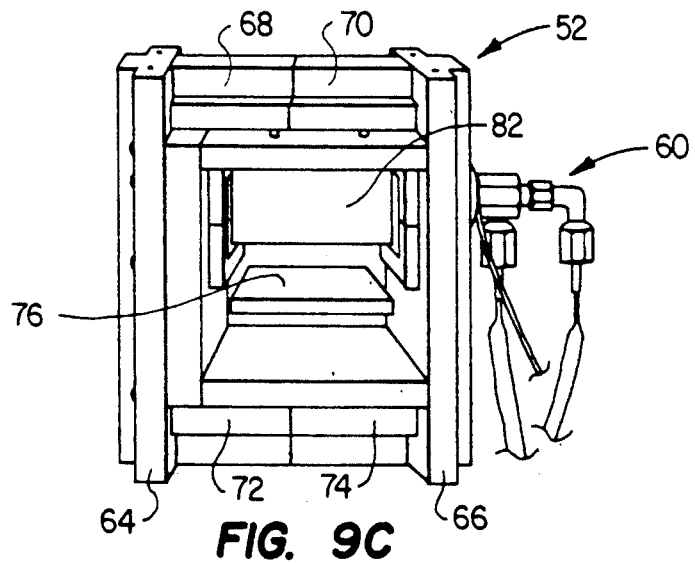
FIG. 9C
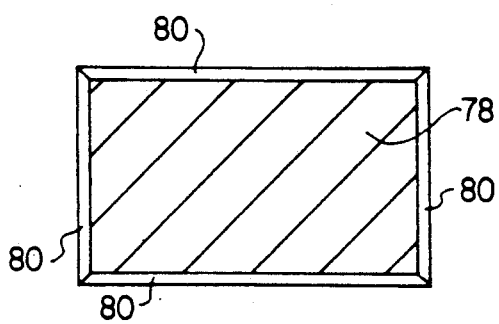
FIG. 10
FIG. 11

SPUTTERING METHOD

BACKGROUND OF THE INVENTION

1. Field of the Invention

This invention relates to a cylindrical magnetron sputtering system and, more particularly, to a cylindrical post magnetron sputtering system especially suitable for deposition of thin films of certain compounds and alloys.

2. DESCRIPIION OF RELATED ART

Thin layers of conducting materials such as metals, metal silicides, and low-resistivity pclycrystalline silicon; and insulating substances such as silicon dioxide, silicon nitride, and phosphosilicate glass, constitute important elements of many semiconductor devices. Additionally, certain newly developed compoumds and alloys that can function as superconducting materials may become widely used commercially in the form of thin film structures.

Various techniques have been developed to produce such layers as part of a device. One such technique, known as film deposition involves supplying component materials for a growing layer from external sources and depositing those materials down upon a sustrate. Such deposition processes are generally carried out in a vapor phase within a reduced pressure atmosphere of a selected gas or gases, or in a vacuum. If the material to be deposited does not react chemically during deposition, the process is referred to as Physical Vapor Deposition or PVD. If, on the other hand, the deposited material is a prcduct of a chemical reaction which occurs within the vapor phase, either on the surface or in the vicinity of the substrate, the process is known as Chexical Vapor Deposition or CVD. Hybrid methods of film deposition, i.e., those which involve both physical and chemical processes, are also known.

One method of physically depositing a film upon a substrate is known as sputtering. A typical sputtering system includes a target (a cathode) and a sutstrate holder (an anode) positioned so that the surface of a substrate upon which the film to be deposited which substrate is placed on the holder, faces the target. The target is a plate of the material to be deposited on the substrate or from which such a film is to be synthesized. The target is connected to a negative voltage supply, either dc or rf, and the sutstrate holder may be either grounded, floating, or biased, as well as either heated, cooled or some combination thereof. A gas, typically at a pressure from a few millitorr to about 100 mTorr, is introduced into a chamber containing the substrate holder and target to provide a medium in which a glow discharge plasma can be initiated and maintained. When the glow discharge is started, positive ions strike the target and stimulate the removal of mainly neutral target atoms therefrom by momentum transfer. These atoms then condense into a thin film formed upon the surface of the substrate placed on the substrate holder. In addition, various particles other than neutral atoms, e.g., electrons and ions, are also produced at the target which may have a significant effect on the properties of the film deposited on the substrate. It is very common for sputtering systems such as those generally described above to have planar cathodes positioned parallel to their respective anodes. Such systems are called planar magnetron sputtering systems.

Heretofore, efforts have been made to deposit various compounds and alloys in uniform films, reproducing the stoichiometry of the source material, using planar magnetrons. For example, for various reasons it has become desirable to be able to deposit thin filas of such compounds and alloys as $Nb_3Sn$, $YBa_2Cu_3O_x$ ("YBCO"), $Bi_2CaSr_2Cu_2O_x$, and $Bi_2Ca_2Sr_2Cu_3O_x$ B"BCSCO") on substrates. In particular, it has become desirable to be able to deposit such compounds and alloys on substrates of a multitude of different sizes.

The above-mentioned efforts to deposit the various listed compounds and alloys using planar magnetrons have revealed a number of significant limitations. At low pressures, for example, virtually no deposit has been effected in the center of certain circular substrates because of erosion caused by negative oxygen ion resputtering. Additionally, analysis of film composition of films deposited at low pressures has revealed undesirable stoichiometric variations. At high pressures, somewhat less negative oxygen ion erosion has been found at the center of substrates subjected to deposition and film composition stoichiometry has been somewhat better than that at low pressure. However, material depcsited on certain areas of the substrates have been found to heavily contaminated because of exposure to the atomsphere. Additionally, atomic percentages of certain elements in targets after sputtering at high pressure have not been found not to be uniform; that is, the various compounds appear to depart the target leaving certain elements "rich" in certain areas and those same certain elements "poor" in other areas. Further details regarding these findings are set forth in the detailed description section below.

In addition to the limitations of planar magnetron sputtering systems described above, other problems and shortcomings of such systems have heretofore been identified. Examining the sputtering process employed in a conventional planar diode sputtering system in more detail, a low pressure abnormal negative glow plasma discharge is maintained within a chamber between a planar cathode (target) and a planar anode (substrate holder). Electrons emitted from the cathode due to ion bombardment thereof are accelerated to near the full applied potential within the cathode dark space, i.e., a relatively nonluminous region between the cathode and the negative glow. Such high energy electrons enter the negative glow as so-called primary electrons where they collide with gas atoms and produce the ions required to sustain the plasma discharge. The primary electron mean free path increases with both increasing electron energy and decreasing pressure within the chamber. At low pressures, ions are produced far from the cathode where their chances of being lost are great. Additionally, many primary electrons hit the anode with high energies, causing a loss that is not offset by impact-induced secondary emission. Thus, ionization efficiencies are low. As the pressure within the sputtering chamber is increased at a fixed voltage, the primary electron mean free path decreases and larger currents are possible; however, at high pressures within the chamber the sputtered atom transport which occurs has been found to be reduced by collisional scattering.

It has also been found that a magnetic field extending parallel to the cathode surface can restrain primary electron motion to regions in the vicinity of the cathode and thereby increase ionization efficiency. It has teen further found that the E x B eleotron drift ourrents can be caused to close on themselves by the use of cylindrical cathodes, which thereby prevent the E x B motion from causing the plasma discharge to be swept to one side. Based upon the foregoing, various cylindrical magnetron systems have been developed. Such systems having spool-shaped cathodes are known as cylindrical post magnetrons. As the adjective "spool-shaped" implies, the cathodes in cylindrical post magnetrons comprise a cylindrical barrel and two disk-like wings. Circularly surrourding both of the wings are wing shrouds. Typically, one wing is made smaller than the other. Anode action of the shroud on the smaller wing acts to terminate uniform extension of plasma outward from the barrel portion of the cathode. In a typical design, the smallest wing size is three times larger, or more, than the gyro radius of the primary electron exitted from the cathode. Also, with respect to typical cylindrical post magnetrons, a solenoid placed coaxially and externally to the cathode is used as the field generator. Such solenoids are generally wound on a core of magnetic material.

With respect to use of cylindrical post magnetrons, heretofore one of the most significant uses has been deposition of photomask quality chromium on glass. Such magnetrons have also been used to produce iron oxide coatings by reactive sputtering. In general, cylindrical post mgnetrons have heretofore been used to coat very large articles and/or very complex-shaped articles.

Based upon the foregoing, it should be appreciated that efforts to deposit such alloys and compositions as $Nb_3Sn$, $YBa_2Cu_2O_x$, $Bi_2CaSr_2O_x$, and $Bi_2Ca_2Sr_2Cu_3O_x$ have not been wholly satisfactory. Planar magnetron sputtering systems have been the primary systems employed heretofore to attempt such deposition. Although other magnetron sputtering systems, such as cylindrical post magnetrons, are known, they have not heretofore been used or specially modified so as to be suitable for use in effecting deposition of high quality films of such materials as $Nb_3Sn$, $Yba_2Cu_3O_x$, $Bi_2CaSr_2O_x$ and $Bi_2Ca_2Sr_2Cu_3O_x$.

SUMMARY OF THE INVENTION

The present invention overcomes the shortcomings of the prior art by providing a novel thin film deposition system and method. The deposition system of the present invention includes a cylindrical sputtering system having a flattened cathode and means for positioning a substrate to be subjected to deposition in the immediate vicinity of the flattened cathode. The method of the present invention includes the steps of causing sputtering in a cylindrical magnetron sputtering system having a flattened cathode wherein the target is positioned in the immediate vicinity of the flattened cathode. The system and method of the present invention overcome the shortcomings and deficiencies of the prior art by effecting uniform deposition of films of certain compounds and alloys, the deposited films having stoichiometry satisfactorily the same as the sputtered material. Compounds and alloys that have been deposited (or could readily be deposited) by the system and method of the present invention include $Nb_3Sn$, $YBa_2Cu_3O_x$, $Bi_2CaSr_2Cu_2O_x$, and $Bi_2Ca_2Sr_2Cu_3O_x$.

Accordingly, it is an object of the present invention to provide a deposition system especially suitable for depositing thin films of certain compounds and alloys.

It is another object of the present invention to effect uniform, stoichiometric deposition of certain materials.

Yet another object of the present invention is to provide a scaleable sputtering system.

Still yet another object of the present invention is to provide a system and method especially effective in depositing $Nb_3Sn$, $YBa_2Ca_3O_x$, $Bi_2CaSr_2Cu_2O_x$ and $Bi_2Ca_2Sr_2Cu_3O_x$.

BRIEF DESCRIPTION OF THE DRAWINGS

Other objects, advantages and novel features of the present invention will become apparent from the following detailed description of the invention when considered in conjunction with the accompanying drawings wherein.

Figure 3:
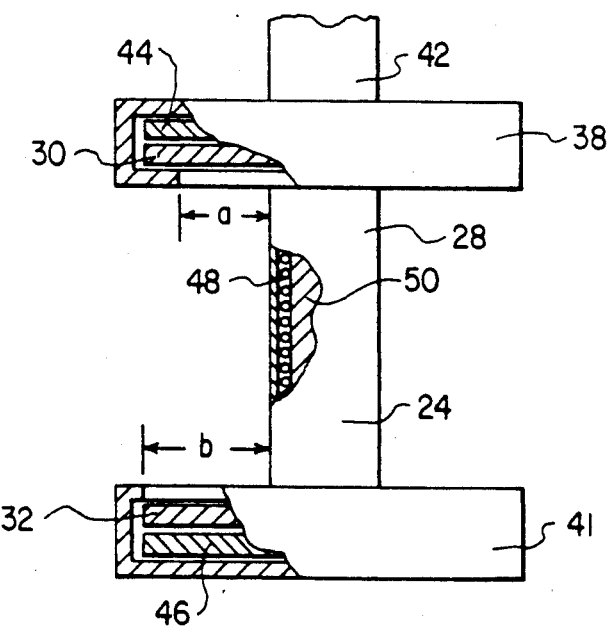
Figure 4:
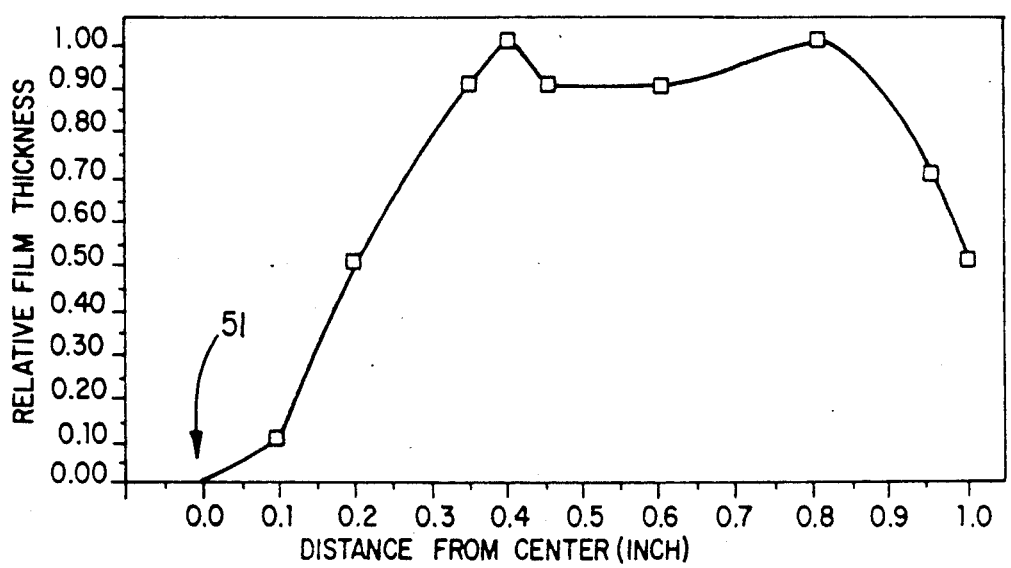
Figure 5:
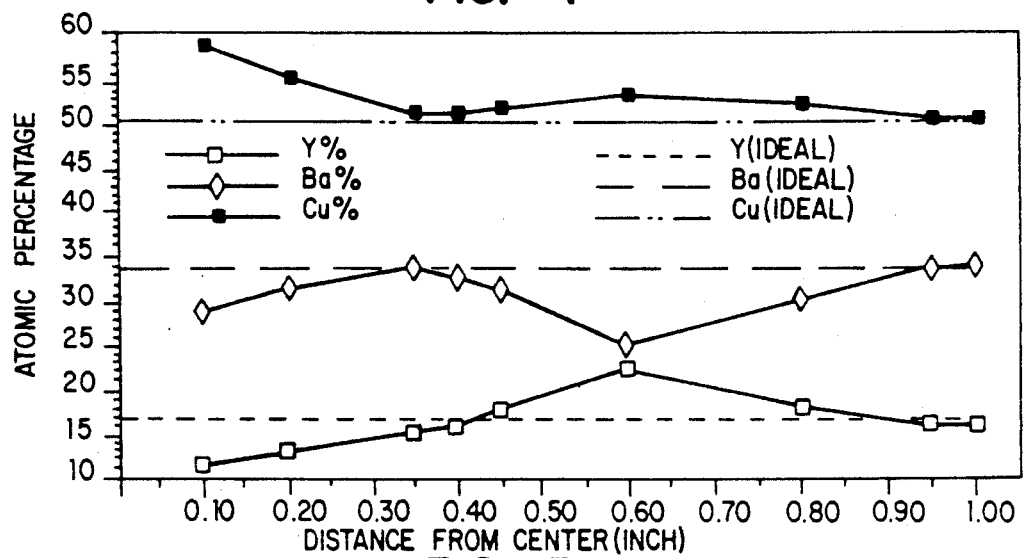
Figure 6:
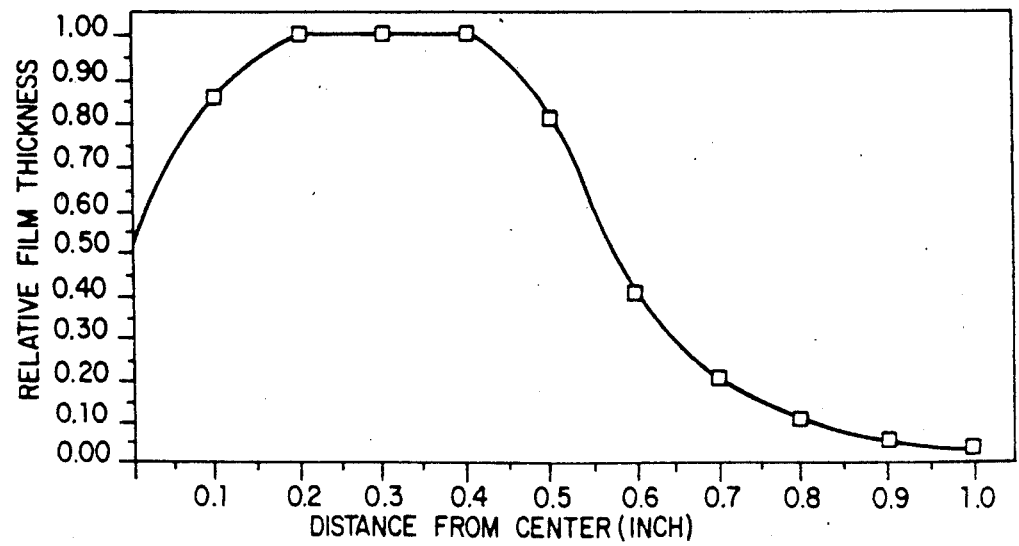
Figure 7:
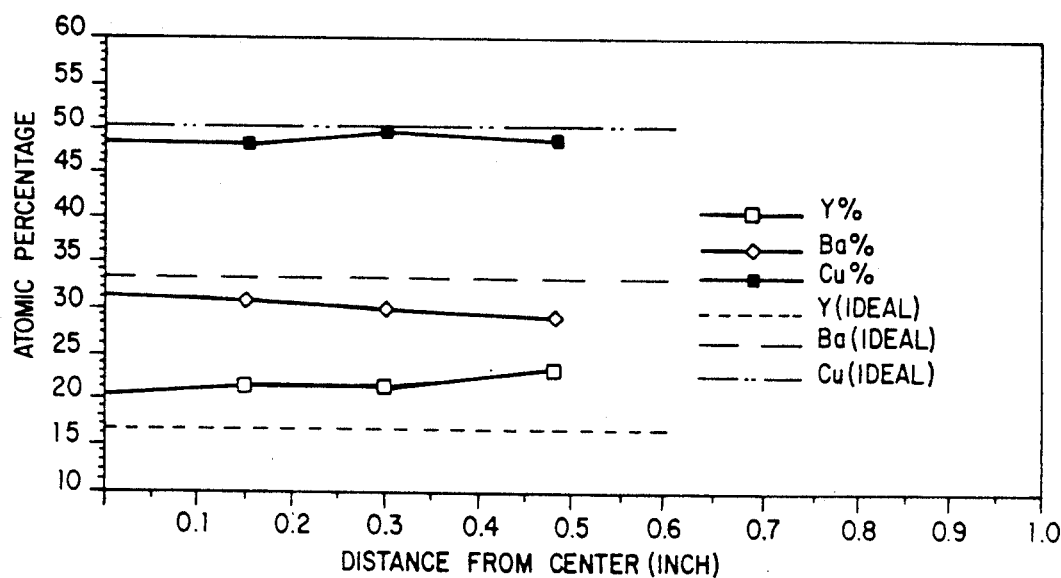
Figure 8:
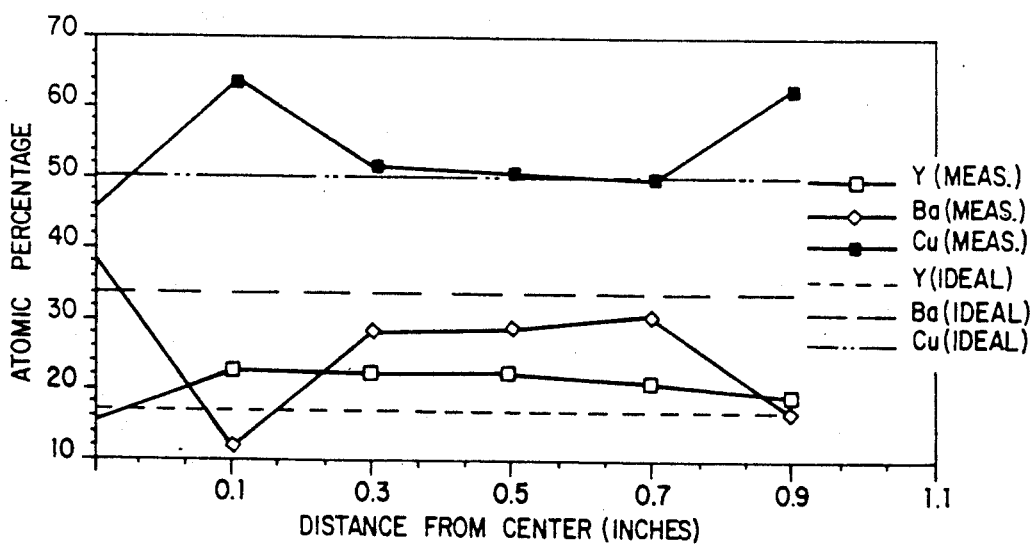
Figure 13:
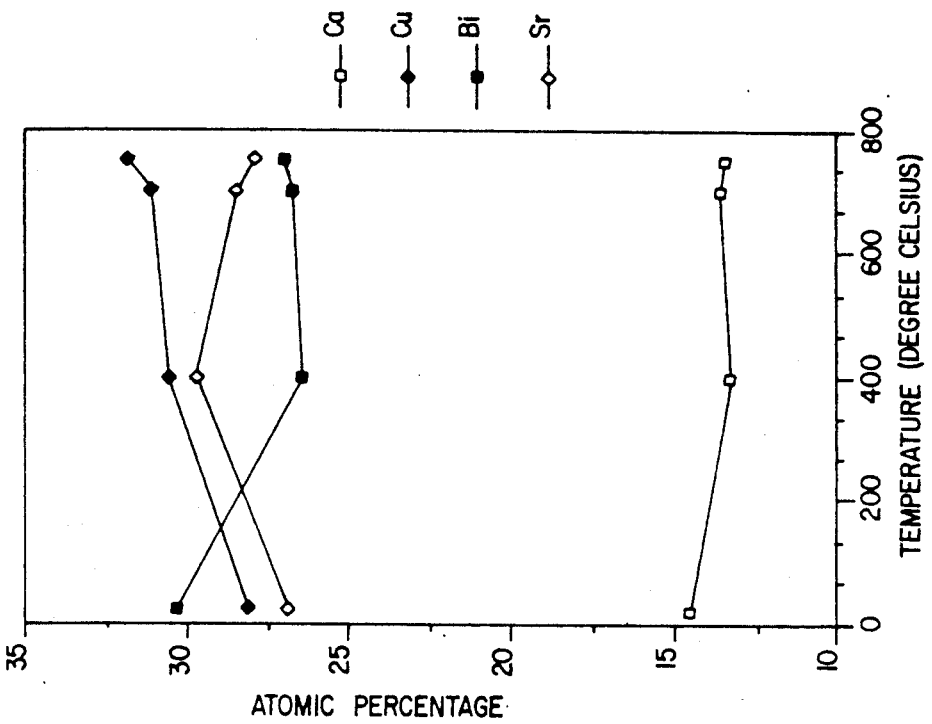
Figure 12:
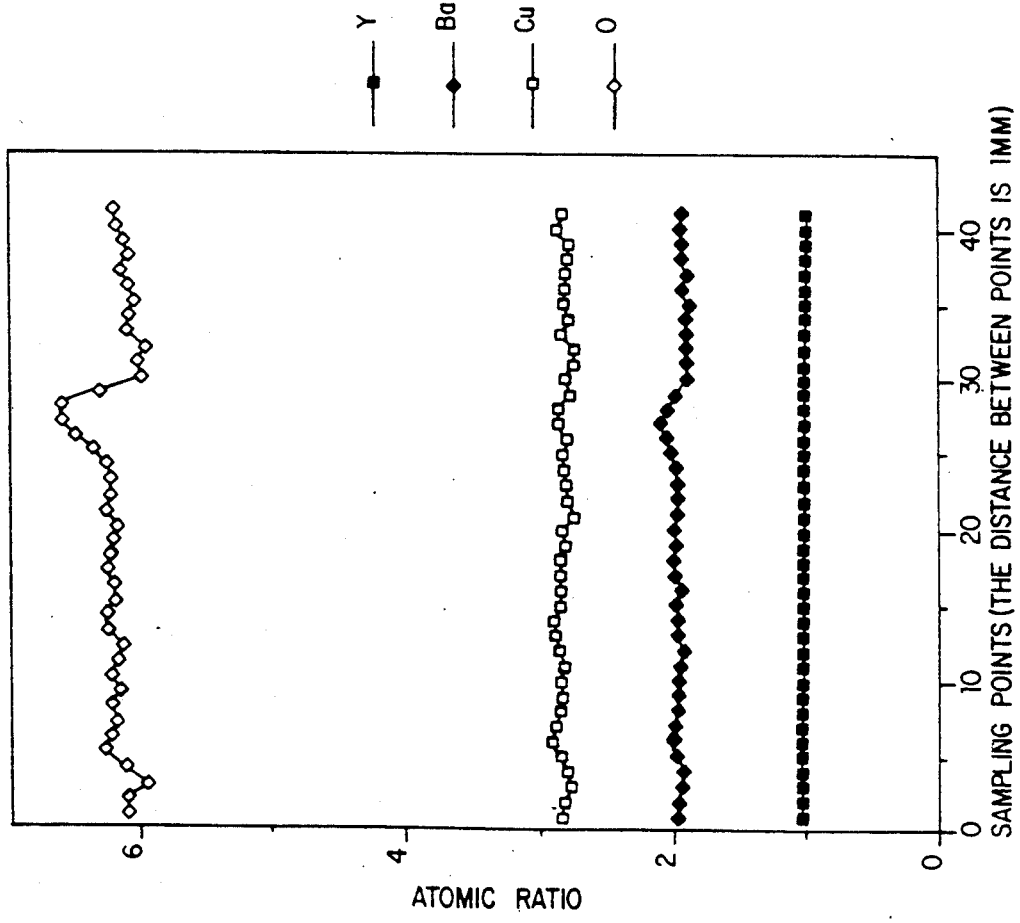
Figure 15:
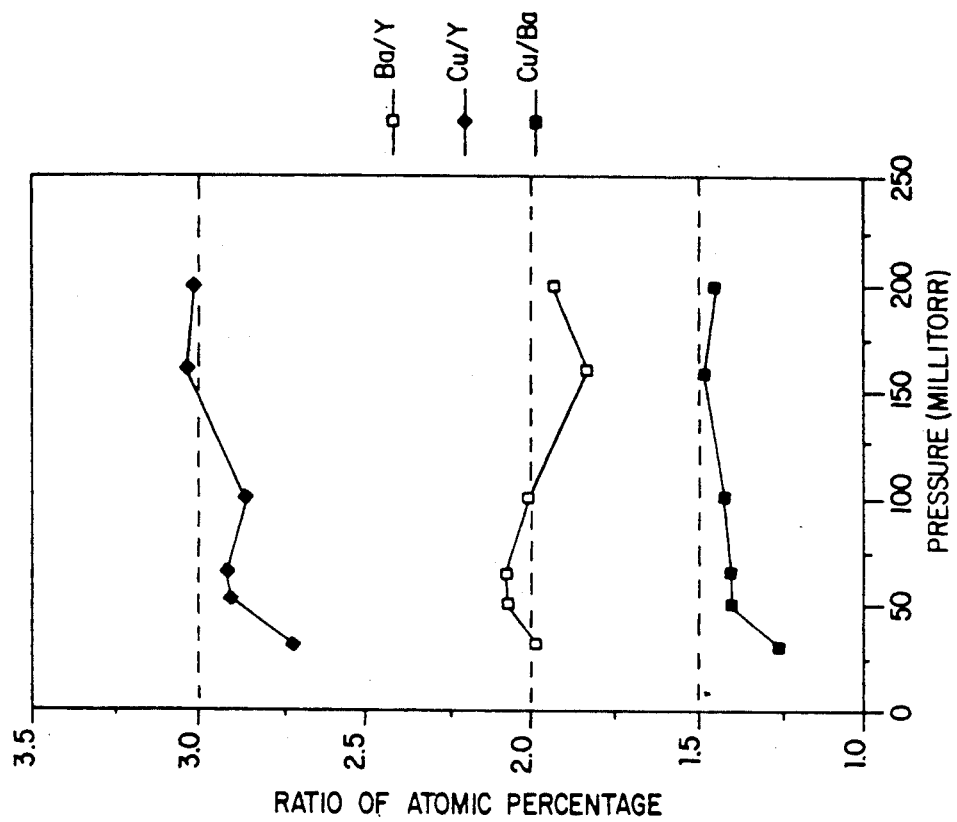
Figure 14:
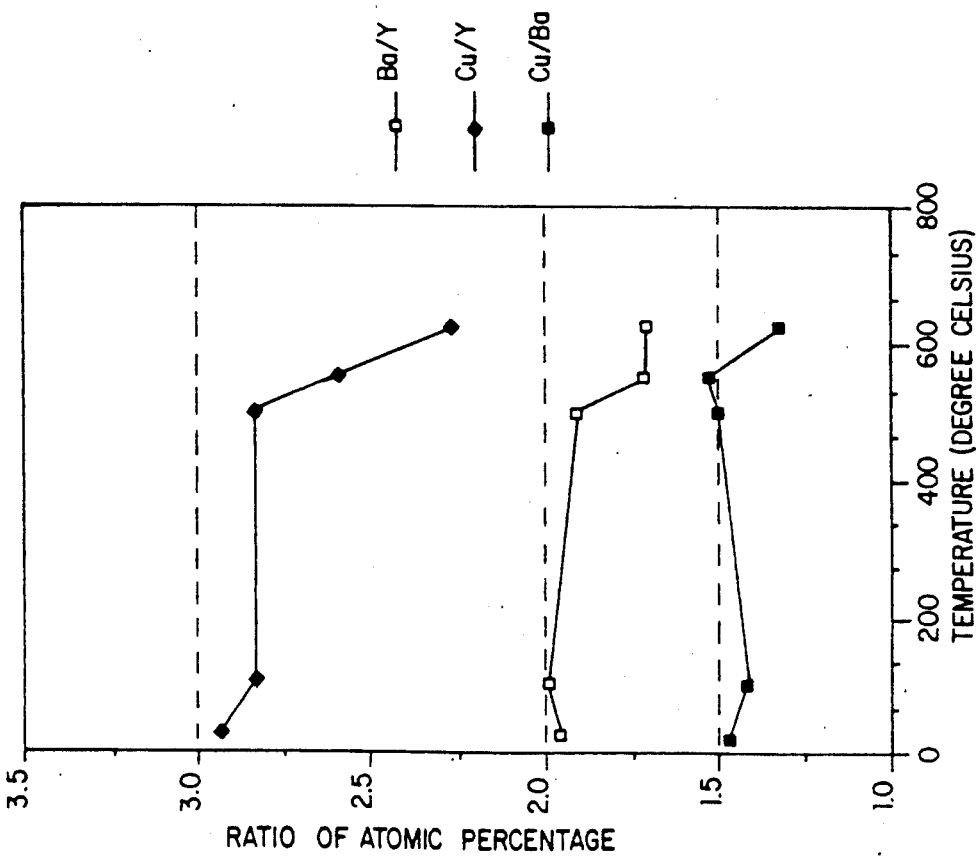

FTG. 2 is a cross-sectional perspective view of a prior art cylindrical post magnetron;

FIG. 3 is a schematic representation, in partial cross-section, of a typioal prior art cylindrical post magnetron sputtering source;

FIG. 4 is a graph depicting relative film thickness versus radial location of YBCO deposition accomplished using a planar magnetron at low pressure with a very low sputter current of 10 milliamps and 0.4 inch substrate-target spacing;

FIG. 5 is a graph depicting film composition versus radial location of YBCO deposition accomplished using a planar magnetron at low pressure with a very low sputter current of 10 millamps and 0.4 inch substrate-target spacing;

FIG. 6 is a graph depicting film thickness versus radial location of YBCO deposition accomplished using a planar magnetron at high pressure with 0.5 inch substrate-target spacing;

FIG. 7 is a graph depicting film composition versus radial location of YBCO deposition accomplished using a planar magnetron at high pressure with 1.8 inch substrate-target spacing;

FIG. 8 is a graph depicting atomic percentage versus radial location on a highly sputter-eroded YBCO planar magnetron target surface;

FIG. 9A, 9B and 9C are a perspective views of a cylindrical magnetron sputtering system, and a certain optional element therefore, according to the present invention;

FlG 10 is a cross-sectional view of a cathode especially suitatle for use in a system according to the present ionvention;

FIG. 11 is a tlock diagram of an alternative embodiment of a sputtering system according to the present invention;

FIG. 12 is a graph depicting the composition of an $YBa_2Cu_3O_x$ film sputtered from a nominally stoichiometric target by the system and method of the present invention as a function of position on the substrate;

FIG. 13 is a graph depicting atomic percentage versus substrate temperature at 400 milliTorr for BiCaSrCuO deposited by the system of the present invention;

FIG. 14 is a graph depicting ratio of atomic percentage versus substrate temperature at low pressure from YBaCuO deposited by the system of the present invention; and FIG. 15 is a graph depicting ratio of atomic percentage versus pressure at a substrate temperature of 500 degrees for YBaCuO deposited by the system of the present invention.

DESCRIPTION OF THE PREFERRED EMBODIMENTS

Figure 1:
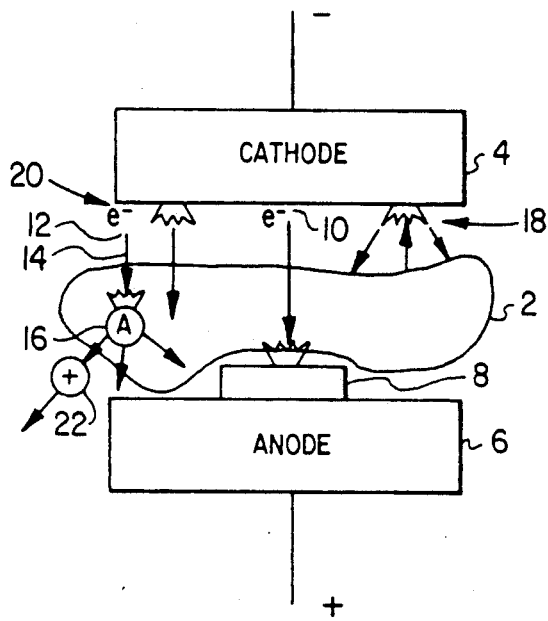
FIG. 1 is a schematic representation of part of a planar magnetron sputtering system.

Referring now to the drawings wherein like reference numerals designate the same or similar elements throughout the several views, FIG. 1 shows part of a prior art planar magnetron sputtering system (for clarity and convenience, magnets that would be incorporated into the systems, in a manner and configuration well known to those skilled in the art, are not shown). As can be seen in FIG. 1, during operation of the planar magnetron sputtering system a low pressure abnormal negative glow discharge (which region is generally defined by the area enclosed within boundary line 2) is maintained between a cathode or target 4 and an adjacent anode or substrate mounting table 6. As mentioned in the description of related art section above, a substrate 8 is placed on anode 6 facing cathode 4. The cathode or target 4 is a plate of material to be deposited on or from which a film is to be synthesized on substrate 8. As indicated in FIG.1, cathode 4, typically, is connected to a negative voltage supply, either dc or rf. Anode 6, on the other hand may be grounded, floating, or biased (connection to a positive voltage source is shown in FIG. 1).

Further with reference to FIG. 1, as also mentioned in the description of related art section above, electrons 10, 12 emitted from the cathode 4 by ion bombardment are accelerated to near the full applied potential in the cathode dark space (i.e., that area in the immediate vicinity of cathode 4 in the direction of anode 6), and enter the negative glow region 2 as so-called primary electrons 14, where they collide with gas atoms (e.g., atom 16) and produce the ions required to sustain the discharge. FIG. 1 also shows sputtered atoms generated in the vicinity of an area generally designated by reference numeral 18, ion-induced secondary exission taking place in an area generally designated by reference numeral 20, and a lost ion 22. All of these aspects have been generally discussed in the description of the related arts section above, and are well known to these persons skilled in the art.

Figure 2:
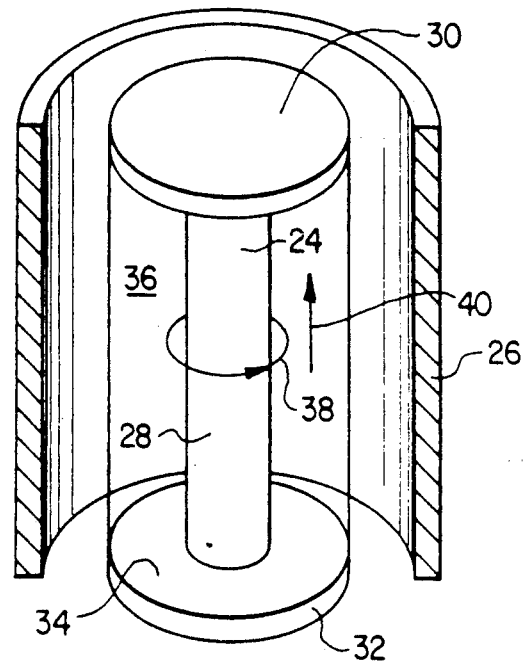

Referring now to FIG. 2, there is shown a typical prior art cylindrical post magnetron sputtering source. This source also illustrates a number of design features discussed in the prior art section above. For example, a spool-shaped cathode 24 may be seen disposed within a cylindrical anode 26. The spool-shaped cathode 24 may be seen to comprise a barrel portion 28 and a first disk-shaped wing 30 and a second disk shaped wing 32. As should be appreciated by those skilled in the art, the upper surface 34 of lower disk-shaped wing 32 (as well as the lower surface of upper disk shaped wing 30 which cannot be seen in FIG. 2) is an electron reflecting surface. As should be further appreciated by these skilled in the art, the region between the two disk-shaped wings and outward from barrel portion 28 of cathode 24 is a plasma sheet region 36. E x B electron motion during operation of the sputtering source shown in FIG. 2 is designated by 38 and the direction of the magnetic field is indicated by arrow 40.

Referring now to FIG. 3, there is shown in greater detail certain aspects of prior art cylindrical post magnetron sputtering sources. For example, circularly surrounding both wings 30, 32 of cathode 24 may be seen wing shrouds 38, 41. Also show in FIG. 3 is a mounting stem 42 which would typically be grounded. Dimension a of wing 30 may be seen to be smaller than dimension b of wing 32. As discussed in the prior art section above, such a design feature is typical in cylindrical post magnetron sputtering sources. Beoause of this difference in dimension, anode action of shroud 38 on smaller wing 30 will act during operation of the system to terminate uniform extension of plasma outward from barrel pcrtion 28 of cathode 24. Elements 44 and 46 are insulators that are typically disposed above the wings 30, 32 and within shrouds 38, 41. Yet another design feature of typical cylindrical post magnetron sputtering sources shown in FIG. 3 is a solenoid 48 placed coaxially and internally to cathode 24, which solenoid 48 functions as a field generator. As is typical, solenoid 48 is shown generally wound on a core of magnetic material 50.

As mentioned in the description of related art section above, planar magnetron sputtering systems, such as generally shown in FIG 1, have heretofore then employed in efforts to deposit films of certain compounds and alloys on various substrates. There are a number of desired characteristics of such desposition. A primary desired characteristic is uniformity. Deposition rate, as well as the flux and energy of reflected neutral particles and negative ions should be uniform over the entire substrate area. The reason for this is to ensure that various film prcperties (for exaxple, stress, resistivity, purity, and specularity), which film properties are generally sensitive to the substrate environment, are also spatially uniform. Especially with reference to the sputtering of certain compounds and alloys, it is desirable that the stoichiometry of the source material be reproduced in the film. As is well appreciated by those skilled in the art, preferential sputtering of the various different components of a film by reflected neutral particles in the case of inert gas sputtering or by negative ions in the cases of sputtering with a reactive electrode gas or with a target containing electro-negative atoms can hamper such reproduction of the stoichiometry of the source material in the film.

As further discussed in the description of related art section above, the various efforts to deposit films of such compounds and alloys as $Nb_3Sn$, $YBa_2Cu_3O_x$, $Bi_2CaSr_2Cu_2O_x$, and $Bi_2Ca_2Sr_2Cu_3O_x$ using planar magnetrons have not been wholly satisfactory. The information depicted in the graphs presented as FIGS. 4, 5, 6, 7 and 8 in the drawings show a number of probems that have rendered the efforts to deposit those compounds and alloys using a planar magnetron sputtering system unsatisfactory. The graphs in FIGS. 4, 5, 6, and 7 all relate to YBCO films deposited by a planar magnetron sputtering system. More specifically, the graphs shown in FIGS. 4 and 5 illustrate results obtained when a planar magnetron sputtering system was operated at low pressure, and the graphs shown in FIGS. 6 and 7 relate to YBCO films deposited by a planar magnetron sputtering system at high pressure. Referring now specifically to FIG. 4, shown therein is data relating to relative film thickness versus radial location for a very low sputter current of 10 milliamps and 0.4 inch substrate-target spacing. It should be appreciated that this graph, as well as the graphs shown in FIGS. 5, 6, and 7, depicts results obtained on a 2"circular substrate. With this in mind, referring tó FIG. 4, it should be clear that the presence of the region generally designated by reference numeral 51 indicates very poor deposition in the center of the substrate. This extrerely low film thickness or absence of deposition is caused, as is explained in greater detail below, by erosion by negative oxygen ions. FIG. 5 is a companion graph to FIG.

4 showing film composition versus radial location under the same conditions imposed in FIG. 4. FIG. 5 clearly shows deviations of Y%, Ba% and Cu% from the ideal, which stoichiometric variations are unsatisfactory.

Referring now to FIG. 6, film thickness versus radial position for 0.5 inch substrate-target spacing of YBCO in a planar magnetron sputtering system at high pressure is shown therein. Comparing the graph in FIG. 6 to the graph in FIG. 4, it can be seen that there is substantially less negative oxygen ion erosion in the center of the substrate at high pressure. It should still be noted, however, that film thickness various significantly, and film thickness is much thinner toward the outside of the substrate than in the region intermediate the center and the outside. The graph shown as FIG. 7 is a companion graph to FIG. 6 that shows film composition versus radial distance for 1.8 inch substrate-target spacing of a YBCO film deposited in a planar magnetron sputtering system at high pressure. Comparing the FIG. 7 graph to the FIG. 5 graph, it may be seen that the stoichiometry is much improved at high pressure, although there still are variant trends.

Micoroscopic analysis of ceramic YBCO targets having typical sputter-eroded areas has shown that in planar magnetron sputtering systems at high pressure a barium rich deposit develops at the center of the target. Referring now to FIG. 8, which shows the atomic percentage versus radial location on such a highly sputter-eroded target surfaoe, the richness of the barium at the center and the extreme process of the barium at 0.1 inch is clearly illustrated. Such effects cannot but help have a significant adverse effect on the stoichiometry of deposited films.

More specifically with regard to the adverse effects mentioned immediately above, the underlying problem is that poor, undesirable deposits on the target get sputtered back to the substrate. This problem does not arise at low pressure because ions simply go to the substrate and stick. At high pressure, however, some materials redeposit on the target, thereby causing "sinks", i.e., areas of redeposited materials on the target, which cause such problems as contaminated, poor deposits being sputtered back to the substrate.

Summarizing the above, deposition of certain compounds and alloys, such as YBCO in planar magnetron sputtering systems has not been satisfactory at low pressure because of negative oxygen ion erosion at the center of substrates, nor has it been satisfactory at high pressure because of poor uniformity of deposition. Film composition is very poor in films deposited at low pressures, and only slightly improved in films deposited at higher pressures.

Referring now to FIG. 9A, shown therein is a perspective view of a modified cylindrical magnetron sputtering system 52 according to the teachings of the present invention. This system 52, like the prior art system shown in FIG. 3, includes a cathode 54 (although very different from cathode 24 shown in FIG. 3, as is discussed further below) having wing portions 56, anode acting wing shrouds 58 (shown in place as well as separated from the remainder of the system shown in FIG. 9A). Additionally, in FIG. 9A are shown portions of a water cooling system 60, various insulators (e.g, element 62), pole pieces 64, 66 and various magnets (e.g., magnets 68, 70, 72, 74). Also shown is a substrate holder 76. Further details regarding these elements are set forth below.

In the system 52 of the present invention, cathode 52 has a flattened, or planar, geometry that can be clearly seen in FIG. 9A. This aspect of the system invention constitutes a significant change from the prior art "spool-shaped" cathode.

Referring now to FIG. 10, it should be appreciated that cathode 52 essentially comprises a rectangular block 78 formed of copper or a similar material well known to those skilled in the art. Such a block 78 may have cooling channels therein (not shown). On at least one side of cathode 52, but preferably on all exposed sides, are bonded plates 80 of material to be deposited, e.g., YBCO. Magnesium oxide materials also make excellent plates. Bonding of such materials, as well as any other material which a person may wish to deposit, can be effected with silver epoxy and/or other similar bonding agents.

If only one side of cathode 52 has material to be deposited bonded thereto, that side would be the side facing substrate holder 76 (shown in FIG. 9A). As an alternative to the system shown in FIG. 9A, which alternative embodiment is shown in FIG. 11, substrate holders 76 may be disposed on both sides of cathode 52 (assuming it is plated on all sides) to reduce sputtering waste and to increase system efficiency. In various embodiments of the present invention a sputter shield 82, such as the one shown in FIGS. 9B and 9C, may be employed to confine sputtered material.

The interaction of the wings 56 and wing shrouds 58 is as described in this section and the description of related section above. Structure and operation of the various other elements are generally conventional and well understood by those skilled in the art. For example, the water cooling system performs a system temperature regulating function and the various magnets (e.g., rectangular, permanent magnets) act to confine and enhance the plasma within the cathode. Materials and methods used for formation of the various elements are all conventional and well known to those skilled in the art.

It should be understood that the various embodiments of the present invention shown in the drawings are not necessarily to scale, nor are the precise dimensions of any of the elements limited to any particular range. However, according to the teachings of the present invention the substrate holder 76 is positioned in relation to cathode 54 so that a substrate held thereon is in the immediate vicinity, i.e., relatively close to the cathode. 0.5 cm is a suitable separating distance. Other possible separation distances are discussed below, as are reasons why such relative closeness between the cathode and a substrate is desirable.

As previously stated, the system of the present invention has been employed to deposit BCSCO and YBCO films. In general, the modified cylindrical magnetron geometry of the present invention has demonstrated large area coverage with excellent stoiciohiometry. Being a cylindrical magnetron type sputtering system, "scaleability" of the system and method of the present invention is also high.

Referring now to FIG. 12, the ability of the system of the present invention to produoe films of the same composition as the target material is shown by the graph therein. In FIG. 12 the composition of an $YBa_2Cu_3O_x$ film sputtered from a nominally stoichiometric target is shown as a function of position on the sample. As should be appreciated by those skilled in the art, the deviations from stoichiometry are within the measurement errors (3%) of the methods used to determine target and film composition. Run-to-run repeatability over a period of months has also been found to be within measurement tolerances. The graph of FIG. 12, when compared to the graph of FIG. 5 (as both systems were operated at low pressure when the results shown were obtained) shows that the system of the present invention provides much improved film composition over prior art systems.

FIGS. 13, 14 and 15 provide further information about the present invention. With special reference to FIG. 13, those skilled in the art should appreciate that the obtained results are quite close to 28% for Cr, Bi and Sr and to 14% for Ca, and that the variations detected therefrom are not significant. FIG. 14 shows that some deviations in atomic percentage can be found in certain films deposited by the present invention when the substrate temperature exceeds about 500° C. The inventors of the system and method of the present invention have found pressures at high substrate temperature levels (e.g., 600-700° C.). FIG. 15 shows excellent film composition results obtained by the system and method of the present invention particularly at the higher pressure levels.

Based upon the foregoing, it should be appreciated how the system and method of the present invention combines a flattened cathode in a cylindrical magnetron sputtering system and relative closeness of cathode and substrate to sputter films having film composition and uniformity significantly better than any heretofore obtained by prior art methods. The inventors of the present invention understand the close proximity between the substrate and target to assure stoichiometry by particle conservation. Close proximity may encompass a significant range of distances, depending upon the pressure of operation. That is, it is understood that a dynamic equilibrium is established where atoms resputtered from the substrate land on the target and are again sputtered from the target onto the substrate. Thus, the net transfer of material from the target to the substrate preserves composition. This is somewhat less significant at higher pressures.

Examining the above in somewhat more detail, the inventors of the present invention perceive that the main problem for obtaining good stoichiometry at low pressure is resputtering of the deposit by negative oxygen ions. Recognizing that a YBCO target is an oxide target, negative oxygen ions therefrom are accelerated across the dark space electric field and bombard the substrate. This leads to preferential resputtering of the target and, in the case of YBCO, usually copper is lost. This resputtering problem disappears at high pressure because the negative oxygen ions lose their energy to the ambient gas.

Based upon the foregoing, it should also be appreciated that the system and method of the present invention involves uniform sputtering of the entire cathode at high pressure. Recalling the discussion herein associated with FIG. 8, in planar magnetrons the discharge is localized in a ring. At high pressure sputtered particles are scattered by the gas and deposited on the cathode surfaces which do not receive much bombardment. The redeposited material is preferentially sputtered and variations in film stoichiometry result. Such deposits also contain a large number of contaminants because they are porous. The deposits react to water and carbon dioxide when exposed to air. Stated another way, the system and method of the present invention is better than the prior art because, in part, prior art planar cathode designs contain "sinks" for sputtered material, which "sinks" do not arise in the system and method of the present inventin. Thus, a target in a system according to the present invention is effectively uniformly eroding and self-cleaning, which are significant advances in the art.

Ihe inventors of the present invention think that the process of the present invention will become the method of choice for depcsiting high temperature superconductors and other compounds and alloys because of the good film compositions obtained. The inventors of the present invention also think that the system and method of the present invention will have broad application to sputtering of refractory metals (e.g., tungsten, molybdenum, chromium, and niobium) because of the uniformity of reflected neutral bombardment of the substrate. No prior art magnetrone with such uniformity are known. As is well known to those persons skilled in the art, specified applications where uniform stress is critical include IC metalization and, particularly, X-ray lithograph masks with tungsten absorber.

It is thus believed that the operation and construction of the present invention will be apparent from the foregoing description. While the methods and apparatus shown and described have been characterized as being preferred, it will be obvious that various changes and modifications may be made therein without departing from the spirit and scope of the invention.

What is claimed is:

1. A method of depositing a compound film on a flat substrate, said flat substrate having a face, said method comprising the steps of:

providing a cylindrical magnetron sputtering system having a flattened cathode with a flattened target mounted on at least one surface thereof, said flattened target also having a surface;

positioning said face of said substrate parallel to and in the immediate vicinity of said surface of said flattened target;

applying a magnetic field parallel to said surface of said flattened target; and causing uniform erosion of said target by sputtering thereof;

wherein said step of causing uniform sputtering erosion of said target material comprises the steps of employing high temperature superconductor target material and operating the sputtering system at high pressure.

* * * * *